US008941380B2

(12) United States Patent
Graesslin et al.

(10) Patent No.: US 8,941,380 B2
(45) Date of Patent: Jan. 27, 2015

(54) REAL-TIME LOCAL AND GLOBAL SAR ESTIMATION FOR PATIENT SAFETY AND IMPROVED SCANNING PERFORMANCE

(75) Inventors: Ingmar Graesslin, Hamburg (DE); Sven Biederer, Hamburg (DE); Ulrich Katscher, Hamburg (DE); Ferdinand Schweser, Hamburg (DE); Peter Boernert, Hamburg (DE); Paul Royston Harvey, Eindhoven (GB); Wilhelmus Reinerius Maria Mens, Eindhoven (NL)

(73) Assignee: Koninkijke Philips N.V., Eindhoven (NL)

( * ) Notice: Subject to any disclaimer, the term of this patent is extended or adjusted under 35 U.S.C. 154(b) by 802 days.

(21) Appl. No.: 12/936,540

(22) PCT Filed: Apr. 13, 2009

(86) PCT No.: PCT/IB2009/051531
§ 371 (c)(1),
(2), (4) Date: Nov. 15, 2010

(87) PCT Pub. No.: WO2009/128013
PCT Pub. Date: Oct. 22, 2009

(65) Prior Publication Data
US 2011/0043205 A1 Feb. 24, 2011

(30) Foreign Application Priority Data
Apr. 16, 2008 (EP) .................................... 08103561

(51) Int. Cl.
*G01R 33/44* (2006.01)
*G01R 33/58* (2006.01)
(Continued)

(52) U.S. Cl.
CPC .......... *G01R 33/583* (2013.01); *G01R 33/5612* (2013.01); *G01R 33/288* (2013.01); *G01R 33/5659* (2013.01)

USPC .......................................... 324/307; 324/309

(58) Field of Classification Search
CPC ............... G01R 33/288; G01R 33/583; G01R 33/5612; G01R 33/5659
USPC .................................................. 324/307, 309
See application file for complete search history.

(56) References Cited

U.S. PATENT DOCUMENTS 6,249,121 B1 * 6/2001 Boskamp et al. ............. 324/318
6,759,847 B2 7/2004 Brinker et al.
(Continued)

FOREIGN PATENT DOCUMENTS

WO 2005001502 A1 1/2005

OTHER PUBLICATIONS

Van Den Berg et al: "Simultaneous B+1 Homogenization and Specific Absorption Rate Hotspot Suppression Using a Magnetic Resonance Phased Array Transmit Coil"; Magnetic Resonance in Medicine, 2007, vol. 57, pp. 577-586.
(Continued)

*Primary Examiner* — Melissa Koval
*Assistant Examiner* — Rishi Patel

(57) ABSTRACT

In a method and apparatus to enable increased RF duty cycle in high field MR scans, a specific energy absorption rate (SAR) calculation processor calculates the local and global SAR or even a spatial SAR map. By incorporating additional information as, e.g. patient position, the SAR calculation accuracy can be increased as well as by using more patient specific pre-calculated information (e.g. based on different bio meshes), the so called Q-matrices. A sequence controller maybe provided to create a global SAR optimal RF pulse. After the optimal RF pulse is applied, the SAR and its spatial distribution are determined. SAR hotspots are also determined. Q-matrices within an appropriate radius around the hotspots are averaged and added to a global Q-matrix in a weighted fashion. After the global Q-matrix is updated, a new optimal RF pulse is created.

16 Claims, 5 Drawing Sheets

(51) Int. Cl.
  *G01R 33/561* (2006.01)
  *G01R 33/28* (2006.01)
  *G01R 33/565* (2006.01)

(56) References Cited

U.S. PATENT DOCUMENTS

| | | | |
|---|---|---|---|
| 7,282,914 | B2 | 10/2007 | Morich et al. |
| 8,099,059 | B2 * | 1/2012 | Graesslin et al. ............... 455/73 |
| 8,238,678 | B2 * | 8/2012 | Cheng et al. .................. 382/240 |
| 2003/0098687 | A1 * | 5/2003 | Arneth et al. ................. 324/309 |
| 2003/0098688 | A1 * | 5/2003 | Brinker et al. ................ 324/309 |
| 2005/0134267 | A1 * | 6/2005 | Zhu .............................. 324/309 |
| 2005/0264288 | A1 * | 12/2005 | Campagna et al. ........... 324/309 |
| 2007/0108976 | A1 | 5/2007 | Morich |
| 2007/0241753 | A1 | 10/2007 | Sodickson et al. |
| 2008/0108892 | A1 * | 5/2008 | Ritter ........................... 600/410 |
| 2008/0182524 | A1 * | 7/2008 | Graesslin et al. ............... 455/73 |
| 2008/0231270 | A1 * | 9/2008 | Fontius et al. ................ 324/307 |

OTHER PUBLICATIONS

Ibrahim et al: "A Whole-Body 7 Tesla RF Excitation Scheme With Much Improved B1+ Field Homogeneity and Local/Global SARS Over Quadrature Excitation"; Proc. Intl. Soc. Mag. Reson. Med., 2007, vol. 15, p. 1013.

Brunner et al: "Enforcing Strict Constraints in Multiple-Channel RF Pulse Optimization"; Proc. Intl. Soc. Mag. Reson. Med., 2007, vol. 15, p. 1690.

Zelinski et al: "Pulse Design Methods for Reduction of Specific Absorption Rate in Parallel RF Excitation"; Proc. Intl. Soc. Mag. Reson. Med., 2007, vol. 15, p. 1698.

Zelinski et al:"Designing RF Pulses With Optimal Specific Absorption Rate (SAR) Characteristics and Exploring Excitation Fidelity, SAR and Pulse Duration Tradeoffs"; Proc. Intl. Soc. Mag. Reson. Med., 2007, vol. 15, p. 1699.

Seifert et al: "Patient Safety Concept for Multichannel Transmit Coils"; Journal of Magnetic Resonance Imaging, 2007, vol. 26, pp. 1315-1321.

Graesslin et al: "A Minimum SAR RF Pulse Design Approach for Parallel Tx With Local Hot Spot Suppression and Exact Fidelity Constraint"; Proc. Intl. Soc. Mag. Reson. Med., 2008, vol. 16, p. 621.

Keil, Andreas et al "Patient Position Detection for SAR Optimization in Magnetic Resonance Imaging", MICCAI 2006, LNCS 4191, pp. 49-57.

Zhu, Yudong "Parallel Excitation with an Array of Transmit Coils", Magnetic Resonance in Medicine, vol. 51, 2004, pp. 775-784.

* cited by examiner

REAL-TIME LOCAL AND GLOBAL SAR ESTIMATION FOR PATIENT SAFETY AND IMPROVED SCANNING PERFORMANCE

FIELD OF THE INVENTION

The present application relates to the diagnostic imaging arts. It finds particular application in the context of patient safety and associated improved scanning performance (in terms of radio frequency (RF) duty cycle) and will be described with particular reference thereto. Furthermore, the estimation and suppression of local specific energy absorption rate (SAR) hot spots in connection with high field magnetic resonance imaging (MRI). It is to be appreciated, however, that it is also applicable to optimization and processing of other information, and is not necessarily limited to the aforementioned applications.

BACKGROUND OF THE INVENTION

For many MR applications at higher field strengths, the local SAR is a limiting factor. The SAR deposition increases with higher field strength and limits the RF power, duty cycle, and flip angles usable, leading to a lengthening of scan acquisition time to meet designated SAR limits. For a single transmitter system, the SAR was relatively easy to calculate, as all antenna elements transmitted with the same amplitude, and a fixed phase shift between them. Furthermore, the RF pulse shapes required for the experiments are known and are stored in a shape library, associated with their SAR. With the advent of multi-transmit systems where each coil element has the potential to independently transmit its own amplitude and phase, SAR must be calculated on a per channel basis also considering the parallel RF transmission pulses, which can only be calculated based on additional information, for example, $B_1$ maps, and are thus experiment/patient specific.

RF safety is a prerequisite for in vivo parallel transmission MRI scans, that is, scanning within SAR limits using multi-channel RF transmit coils must be guaranteed. Scans cannot be started unless they are "SAR safe." In an MR system with multiple transmit channels, SAR reduced RF pulses can be calculated by incorporating electrical field information into an RF pulse design. In the past, methods have been used that construct RF pulses in consideration of known SAR hotspots that are common to every individual (e.g., the eyes). This is generally not sufficient for whole body imaging, as SAR hotspots can vary in both position and magnitude from patient to patient, and from RF pulse to RF pulse. Thus, an RF pulse sequence that limits SAR to acceptable levels in one patient may not be so limiting with respect to another patient. Moreover, RF sequences that accommodate a known static hotspot may inadvertently exacerbate unknown, patient specific hotspots at other locations.

One possible solution is to develop a worst-case scenario estimation of SAR that would be safe for all patients. This solution, however, would limit the allowed RF duty cycle so much that the MRI system would become seriously compromised for use in conjunction with in vivo parallel transmission scans. The ability to tailor a SAR calculation to the patient would be more beneficial than using a blanket scenario or known term for all patients.

One reason in particular that RF sequences are currently not constructed on a patient-by-patient basis, is that for clinically relevant spatially RF pulses (e.g. local excitation or zoom imaging), parallel transmission systems that can accelerate these kinds of RF pulses (TxSENSE) are required. For an RF sequence, an underlying prerequisite is the availability to efficiently estimate the SAR. Moreover, availability of patient related E-fields and patient position are highly desirable for an accurate SAR estimation (including global and local SAR values and optionally a SAR map.) Field data obtained by simulations differ to some degree from the actual fields in the scanner. Use of bio-mesh models for E-field simulations instead of the actual patient leads to a systematic error that is difficult to characterize. For a standard, single channel birdcage coil RF transmit assembly, the RF waveforms are identical for every Tx coil element and only a phase increment (e.g. 45° for 8 elements) exists. For multiple Tx coil elements, the calculation is more complex, as each channel may have a different but static amplitude and phase. In more complex scans, such as for 2D/3D spatially selective pulses, each channel may have dynamically changing amplitudes and phases.

In order to calculate all SAR types as specified in the standard (local and global) and optionally a SAR map of a patient for a multi-channel RF transmit system, (e.g., eight transmit channels) the system performs a high number of calculations (e.g. TeraFLOPs): as high as $10^{10}$ calculations or more, depending on the resolution of the model and cells used for the calculation. This process would take several minutes and cannot practically be carried out in real time as the patient waits inside the scanner for the actual diagnostic scan to begin.

The present application provides a new and improved magnetic resonance system, which overcomes the above-referenced problems and others.

SUMMARY OF THE INVENTION

In accordance with one aspect, a magnetic resonance system is provided. A main magnet generates a substantially uniform main magnetic field in an examination region. A radio frequency assembly induces magnetic resonance in selected dipoles of a subject in the examination region, and receives the magnetic resonance. A specific energy absorption rate calculation processor calculates a specific energy absorption rate and determines local specific energy absorption rate hotspots. A sequence controller designs an RF excitation pulse that accounts for the local specific energy absorption rate hotspots and keeps energy delivered to the hotspots under acceptable levels.

In accordance with another aspect, a magnetic resonance system is provided. A main magnet generates a substantially uniform main magnetic field in an examination region. A radio frequency assembly induces magnetic resonance in selected dipoles of a subject in the examination region, and receives the magnetic resonance. A specific energy absorption rate calculation processor calculates a specific energy absorption rate and determines local specific energy absorption rate hotspots. A graphics card processes non-graphics information in parallel.

In accordance with another aspect, a method of magnetic resonance is provided. A substantially uniform main magnetic field is generated in an examination region. Magnetic resonance is induced in selected dipoles of a subject in the examination region, and the magnetic resonance is received. A position of the subject within the examination region is determined. A specific energy absorption rate is calculated. A globally safe RF pulse waveform that accounts for the calculated specific energy absorption rate is calculated. This may be done iteratively, if e.g., the first RF pulse estimate does not meet the SAR limits, or other system parameters, like the $T_R$ (repetition time) are prolonged.

One advantage is the ability to efficiently verify that a parallel transmission scan does not violate existing FDA or International Electrotechnical Commission limits.

Another advantage lies in increased calculation speed of SAR values, hotspots, and spatial SAR distribution.

Another advantage lies in the ability to customize the SAR calculation to individual patients.

Another advantage lies in the ability to create an optimal RF pulse sequence based on a patient's SAR profile.

Another advantage lies in the ability to determine specific information, such as E-fields and patient positions, on a patient-by-patient basis.

Another advantage lies in the ability to detect anomalies or surgical implants for SAR model adaptation.

Still further advantages of the present invention will be appreciated to those of ordinary skill in the art upon reading and understand the following detailed description.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION OF EMBODIMENTS

Figure 1:
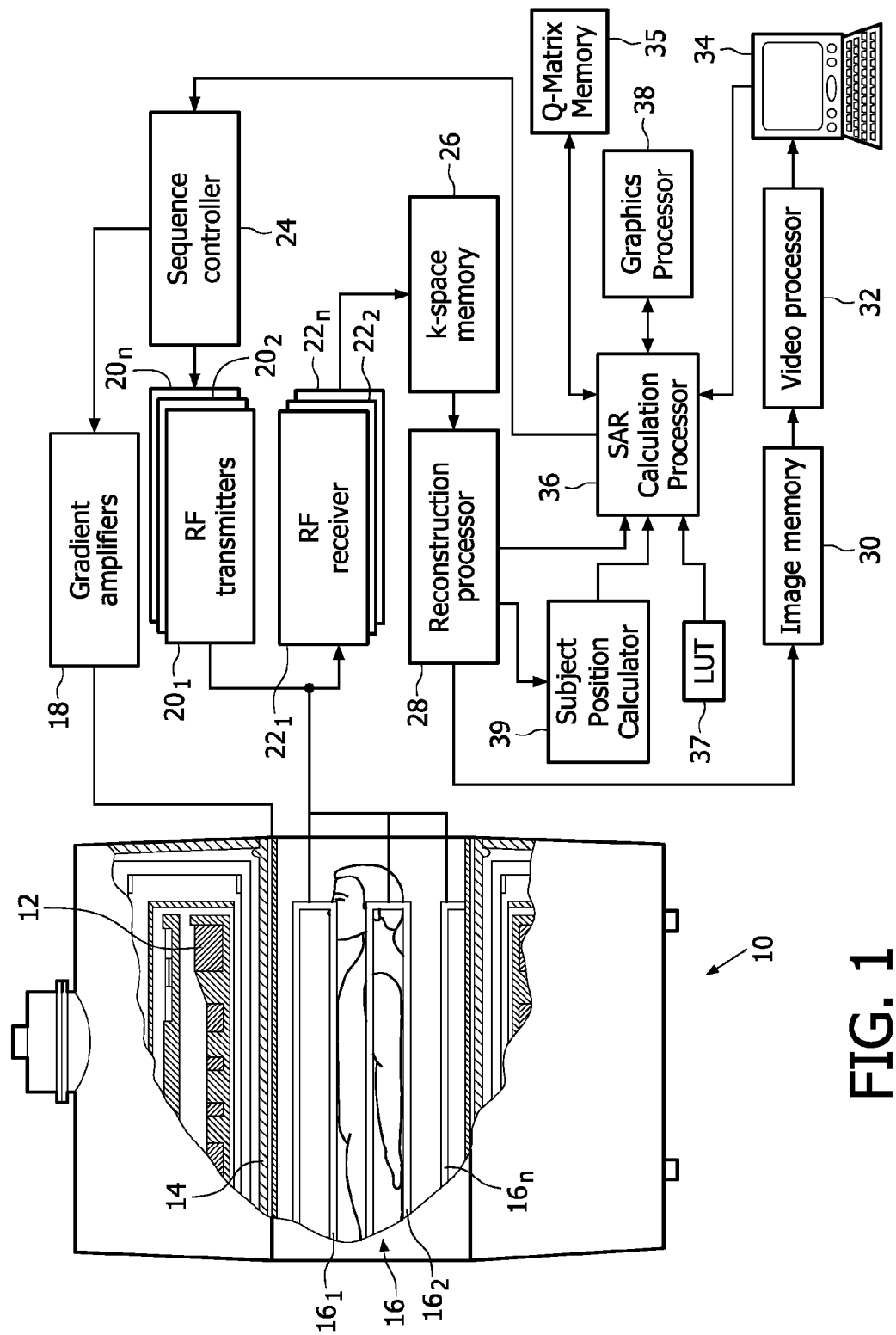
FIG. 1 is a diagrammatic illustration of a magnetic resonance imaging apparatus in accordance with the present application.

With reference to FIG. 1, a magnetic resonance scanner 10 is illustrated as a closed bore system that includes a solenoidal main magnet assembly 12, although open and other magnet configurations are also contemplated. The main magnet assembly 12 produces a substantially constant main magnetic field $B_0$ oriented along a horizontal axis of an imaging region. It is to be understood that other magnet arrangements, such as vertical, and other configurations are also contemplated. The main magnet 12 in a bore type system may typically have a field strength of around 0.5 T to 7.0 T or more.

A gradient coil assembly 14 produces magnetic field gradients in the imaging region for spatially encoding the main magnetic field. Preferably, the magnetic field gradient coil assembly 14 includes coil segments configured to produce magnetic field gradient pulses in three orthogonal directions, typically longitudinal or z, transverse or x, and vertical or y directions.

A radio frequency coil assembly 16, including n coil elements $16_1, 16_2, \ldots 16_n$, generates radio frequency pulses for exciting resonance in dipoles of the subject. The signals that the radio frequency coil assembly 16 transmits are commonly known as the $B_1$ field. The radio frequency coil assembly 16 also serves to detect resonance signals emanating from the imaging region. The illustrated radio frequency coil assembly 16 is a send/receive coil that images the entire imaging region, however, local send/receive coils, local dedicated receive coils, or dedicated transmit coils are also contemplated. In one embodiment, the radio frequency coil assembly 16 includes an 8 channel transmit/receive antenna.

Gradient pulse amplifiers 18 deliver controlled electrical currents to the magnetic field gradient assembly 14 to produce selected magnetic field gradients. A radio frequency transmitter array 20, including n transmitters $20_1, 20_2, \ldots 20_n$, preferably digital, applies radio frequency pulses or pulse packets to the radio frequency coil assembly 16 to excite selected resonance. In the illustrated embodiment, the number of coil elements and the number of transmitters are the same. However, more than one coil element can be associated with each transmit channel. A radio frequency receiver array 22, including n receivers $22_1, 22_2, \ldots 22_n$ in the illustrated embodiment, is coupled to the coil assembly 16 or a separate receive coil array to receive and demodulate the induced resonance signals.

To acquire resonance imaging data of a subject, the subject is placed inside the imaging region. A sequence controller 24 communicates with the gradient amplifiers 18 and the radio frequency transmitters $20_1, 20_2, \ldots 20_n$ to excite and manipulate magnetic resonance in the region of interest. The sequence controller 24, for example, produces selected repeated echo steady-state, or other resonance sequences, spatially encodes such resonances, selectively manipulates or spoils resonances, or otherwise generates selected magnetic resonance signals characteristic of the subject. The generated resonance signals are detected by the RF coil assembly 16 or local coil assembly (not shown), communicated to the radio frequency receiver 22, demodulated, and stored in a k-space memory 26. The imaging data is reconstructed by a reconstruction processor 28 to produce one or more image representations that are stored in an image memory 30. In one suitable embodiment, the reconstruction processor 28 performs an inverse Fourier transform reconstruction.

The resultant image representation(s) is processed by a video processor 32 and displayed on a user interface 34 equipped with a human readable display. The interface 34 is preferably a personal computer or workstation. Rather than producing a video image, the image representation can be processed by a printer driver and printed, transmitted over a computer network or the Internet, or the like. Preferably, the user interface 34 also allows a technician or other operator to communicate with the sequence controller 24 to select magnetic resonance imaging sequences, modify imaging sequences, execute imaging sequences, and so forth. At the interface 34, the user can select a SAR model, and all or part of the remaining parameters can be determined with user interaction and feedback.

A specific energy absorption rate (SAR) processor 36 calculates SAR for portions of the subject within the coil assembly 16. In one embodiment, the SAR calculation processor 36 creates a SAR map of the whole body that includes regions of increased SAR or hotspots. For a standard scan in which there is a constant change of amplitude and of phase for standard RF pulses, SAR can be calculated very quickly as only the phase/amplitude relation is relevant. Thus, the calculation of a single RF sample is sufficient as the amplitude/phase relation does not change the pulse. A standard scan could be implemented by typical MRI systems and parallel transmission systems using constant phases and amplitudes.

Provided that the RF field inside the subject responds linearly to the currents driving the field, the SAR can be expressed in a quadratic form in the pulse samples b†Qb, where † denotes the conjugate transpose, b is the RF waveform sample, and Q is a Hermitian positive definite matrix resulting from the solution of Maxwell's equations and corresponding to a specific subject volume. The SAR map is created by considering several inputs, including trajectory, $B_1$ field maps, target excitation pattern, and a global Q matrix. Existing SAR optimal algorithms typically only constrain a specific known static local region, such as the eyes. As mentioned previously, this is inadequate for full body imaging because other hotspots that vary by subject may be present. Statistically constraining a spatial region in which a hotspot occurs may result in new hotspots at other locations. A memory 35 can store pre-calculated data of one or multiple patient positions to prevent re-calculation of the Q-matrices when unnecessary. Additionally, the memory 35 can store SAR values so that SAR need not be calculated repetitively for identical pulses. A unique ID can be used to identify the pulses.

For local SAR calculation, the SAR of each volume element of a patient model is averaged until the desired mass is reached. The SAR value for a volume element is indicative of the SAR along the edge of the volume element, and the data is interpolated to acquire the SAR value at the center of each voxel.

Some of the information can be pre-calculated and stored in a look up table (LUT) 37. Scanner specific information such as electric fields and $B_1$ field maps are stored in the LUT 37. An appropriate starting bio-mesh can be selected from a body model memory of the LUT 37 by knowing the patient's height, weight, sex, and position in the MR scanner. While the height, sex, and weight can be entered by an operator before the scan, the patient position is determined by a subject position processor 39. One way to obtain patient position and refine the patient model is to use a moving bed approach. Images are acquired while the patient is being moved into the bore of the scanner, resulting in a low-resolution 3D volume data set. Alternately, a short pre-scan could be performed once the patient is in the final position in the bore. This data can be segmented, for example, by thresholding or some other processing means. Next, the position of the patient can be obtained by correlation methods with existing models, for example, from transverse slices of the patient or the detection of landmarks. Also, the patient volume and size could be estimated. Anomalies such as implants or missing organs can also be detected. In this way, the starting body model is customized to the current patient.

Once the patient position has been determined, the SAR calculation processor 36 consults the LUT 37 to get the corresponding E-field data as a function of the input parameters (weight, sex, position, etc.) using an appropriate combination thereof. If deviation from all models stored in the LUT 37 is too large, then a very conservative SAR estimation could be used. In the case of implants for a particular scan, appropriate SAR limits for the device can be retrieved from the LUT 37. After the initial position has been determined, any table movement can be monitored by the subject position processor 39 and can be used to accurately determine the new position of the patient.

In an alternate embodiment, a coarsely segmented body model can be obtained from the moving bed imaging data or pre-scan, which can be used for a fast adaptation of existing E-fields of similar patients or a fast estimation of e.g. a homogeneous model. Use of a homogenous model introduces inaccuracies in conductivity and permittivity that are relatively small. The differences between using data from a homogenous model and actual data are tolerable, such that use of a model is a viable alternative.

Figure 2:
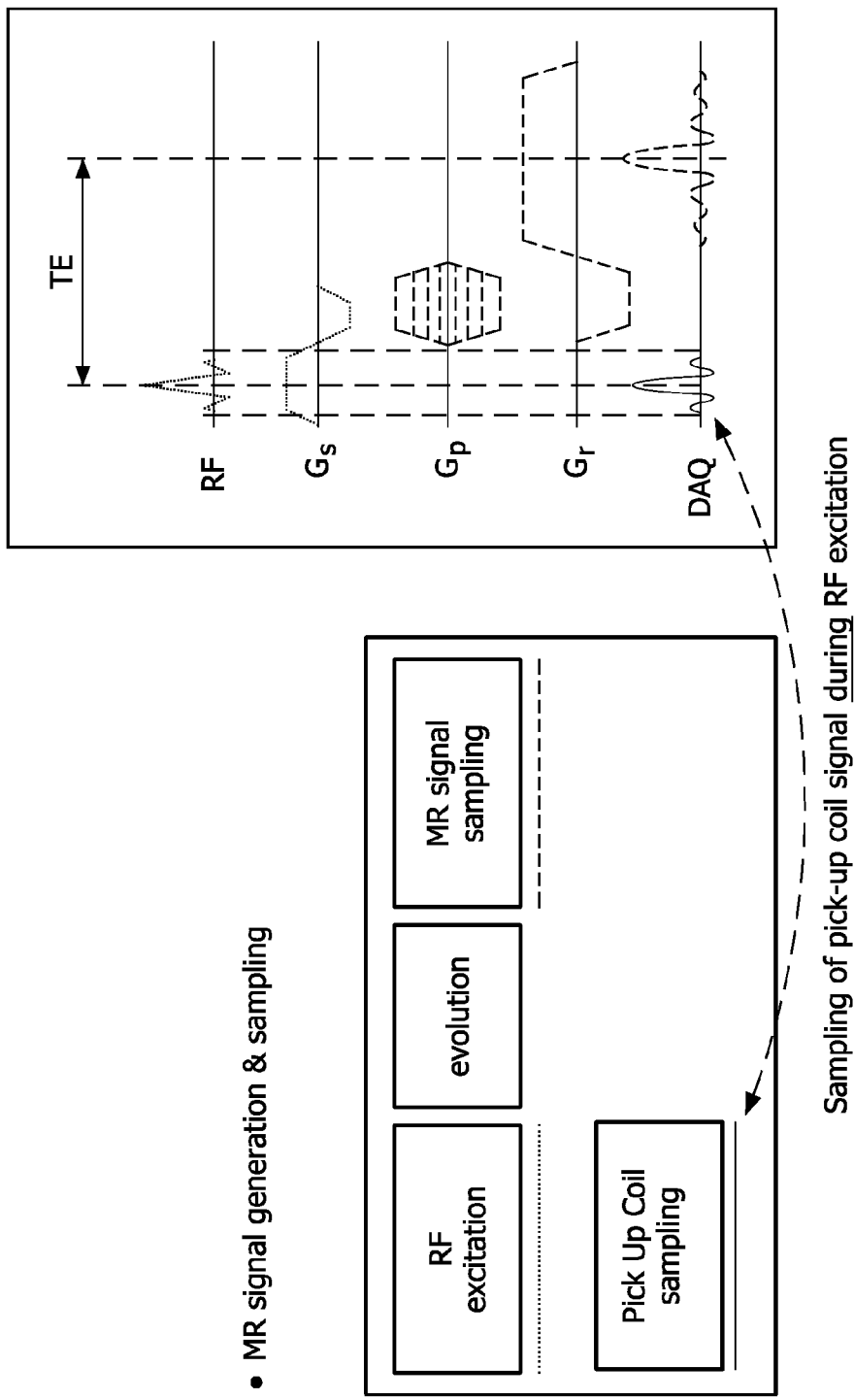
FIG. 2 includes exemplary waveforms for PUC sampling during RF excitation.

In another alternate embodiment, patient position can be determined by using pickup coils (PUCs). Each transmit element of a multi channel transmit coil is equipped with a PUC for monitoring current in each element to ensure patient safety and facilitate system adjustment. In general, the patient's presence influences the coil's properties. Thus, the loading of the RF coil elements changes during the movement of the patient through the magnet bore. This movement can be detected as a phase change. This can be translated to an approximate position of the patient in the MR system. This is possible because the currents in the coil elements are sampled during the RF pulses, as shown in FIG. 2. Exemplary RF and gradient waveforms are provided. The dotted lines represent the RF excitation waveforms, the dashed lines represent the MR signal sampling waveforms, and the solid lines represent the PUC sampling waveform. Additionally, the PUCs can be used to sense abnormal currents in the RF coil channels and initiate a scan termination if safety parameters are exceeded.

Once the SAR map is created, the sequence controller 24 designs an RF pulse sequence that is tailored to the present subject's SAR map. This could also be done by a host reconstructor or a separate graphics card that calculates RF pulses. The sequence controller 24 introduces weighting factors that specify a trade-off between different hotspot regions and the global SAR. For instance, depending of the spatial SAR distribution of an RF pulse that is optimal with respect to global SAR, hotspot reduction is possible via $Q_1 = Q_{global} \ \Sigma q_i \ Q_{critical\_region(i)}$, where $Q_1$ is the modified Q-matrix, $Q_{global}$ is the original global Q-matrix, $q_i$ is a weighting factor, and $Q_{critical\_region(i)}$ is a Q-matrix of a volume immediately around the hotspot (e.g. a 3×3×3 voxel volume). The sequence controller 24 iteratively processes the SAR map to find the best weighting factors $q_i$ to satisfy existing SAR limits and to decrease the most limiting SAR value.

Figure 3:
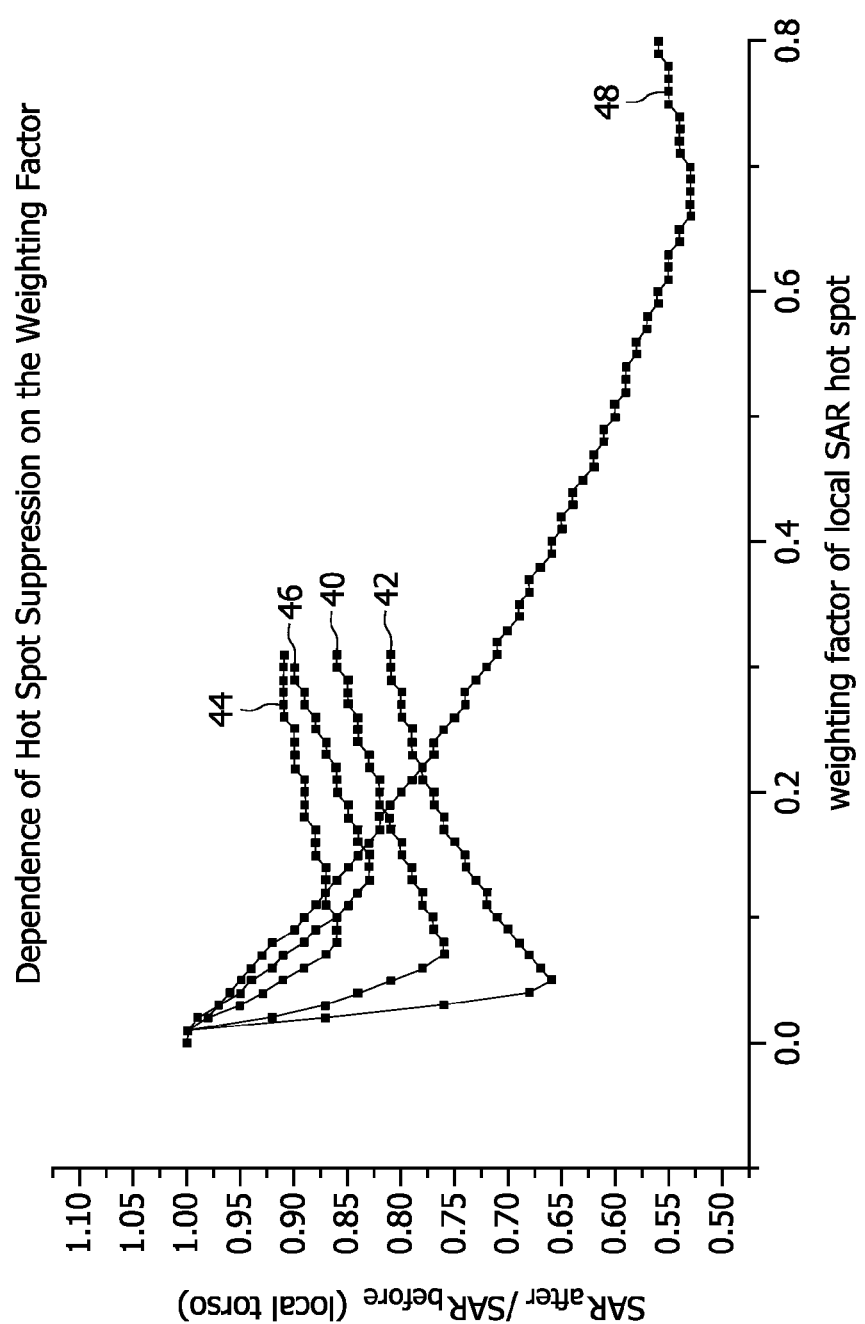
FIG. 3 is a graph of dependence of hot spot suppression on an empirically determined weighting factor.

More specifically, the sequence controller 24 directs the gradient assembly 14 and the RF assembly 16 to apply the newly designed RF pulse sequence. The SAR calculation processor 36 then recalculates the SAR map. Positions of local hotspots are once again determined. Next, the sequence controller 24 volume averages the Q-matrices ($Q_{critical\_region(i)}$) of the hotspots, and weights them. The weighting factors have been determined empirically based on the distance (z) of the hotspot from the isocenter of the magnet. With reference now to FIG. 3, the troughs of the curves represent the optimal weighting factor for that distance. Curve 40 represents hotspot suppression with z=20 cm. Curve 42 represents hotspot suppression with z=40 cm. Curve 44 represents hotspot suppression with z=60 cm. Curve 46 represents hotspot suppression with z=80 cm. Lastly, curve 48 represents hotspot suppression with z=100 cm.

The weighted, volume averaged Q-matrices are added to the global Q-matrix. The radius of the spatial averaging around each hotspot, the hotspot positions, the local Q-matrices, and the selected weighting factors are all taken into consideration when recalculating $Q_1$, the updated global Q-matrix. Once the Q-matrix has been updated, the sequence controller 24 designs a new, SAR optimized RF pulse sequence based on the updated Q-matrix $Q_1$. As before, lower SAR values are obtained at the critical regions. The sequence controller 24 and the SAR calculation processor 36 can apply one or more of the above steps iteratively until SAR converges to a minimum value at the hotspots, or alternatively, until a desired safe SAR level is reached. In some cases, it might not be necessary to apply the iterations until SAR converges to a minimum if SAR reaches a safe level before it converges. Alternatively, the repetition time $T_R$ can also be prolonged, or the flip angle can be reduced, or a combination of the two. Also, the RF pulse can be re-optimized if the patient is moved.

This iterative process is computationally intense, requiring a large amount of data processing capacity each time the global Q-matrix is updated. With existing systems, each iteration could take several minutes, which is impractical with a patient waiting in the scanner. Each Q-matrix calculation accounts for the correct amplitude information and the correct phase information for each channel involved. In one embodiment, each voxel of the body is calculated separately, giving the highest resolution possible. The average amount of voxels in a bio-mesh is on the order of 750,000 for a voxel size of 5 mm. When phase, and amplitude information is processed for each RF channel's effect on each voxel, a high number of calculations (e.g. TeraFLOPs) are required to calculate the global and local SAR and to produce a SAR map. As mentioned previously, one embodiment includes an RF assembly 16 with eight channels, but it is to be understood that assemblies with more channels are possible, with any arbitrary combination of channels operating at any given time. SAR is calculated for these situations accordingly.

In the embodiment of FIG. 1, the SAR calculation processor 36 delegates the task to a sub-processor 38, such as a high-performance graphics card. The sub-processor 38 can be located in the SAR calculation processor 36 itself, in a host computer, or in a spectrometer. Since the SAR calculations of the individual voxels are not dependant on one another, they do not have to be processed one after another, that is, they can be processed in parallel. The sub-processor 38 such as a graphics card offers many parallel processing channels (e.g. 128, 256 etc.) to speed up the calculation of the SAR. For example, by using a graphics card with 128 processing channels, calculation of the SAR was accelerated by a factor of 100 over using a 3 GHz processor alone to calculate the SAR. Resultantly, calculation of the SAR of an RF pulse for a single biomesh can be performed in seconds instead of minutes. This allows the iterative process of converging SAR hotspots to minima described above to be performed in a practically applicable amount of time. In one embodiment, if the sub-processor 38 is unavailable (for example, if the graphics card is broken) then the SAR calculation processor 36 can complete the calculation so that scanning is still possible.

In an alternate embodiment, voxels can be grouped by their proximity and averaged, reducing the number of volume elements from roughly 750,000 to, for example, 100,000. This further reduces calculation time of the SAR, but sacrifices some resolution and accuracy in the calculated SAR maps. As a consequence, an extra safety margin is added to obtain the estimated SAR values for a scan.

In another alternate embodiment, amplitude and channel information is considered, but phase information is not. This also speeds up the calculations, but calculates a less accurate SAR map, erring on the side of caution. The SAR values are overestimated in this embodiment.

In another alternate embodiment, amplitudes are set to maximum in each corresponding channel. This method again cuts the amount of calculations down, since only the maximum amplitude for each channel is considered, but sacrifices the quality of the resultant calculations, again, erring on the side of caution.

Figure 4:
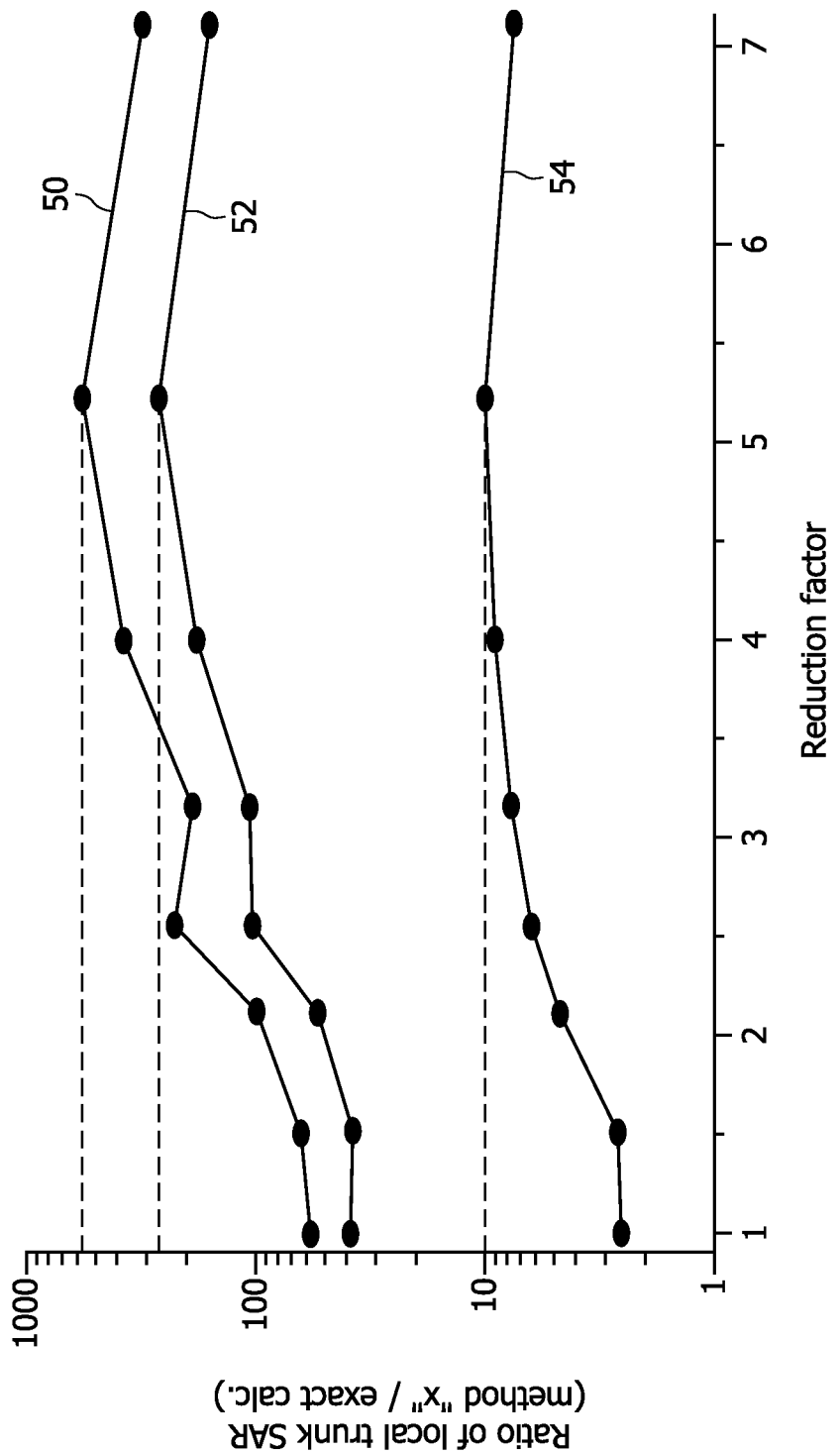
FIG. 4 is a comparison of alternate methods that consider less than all of the available information with an embodiment that considers all of the information.
Figure 5:
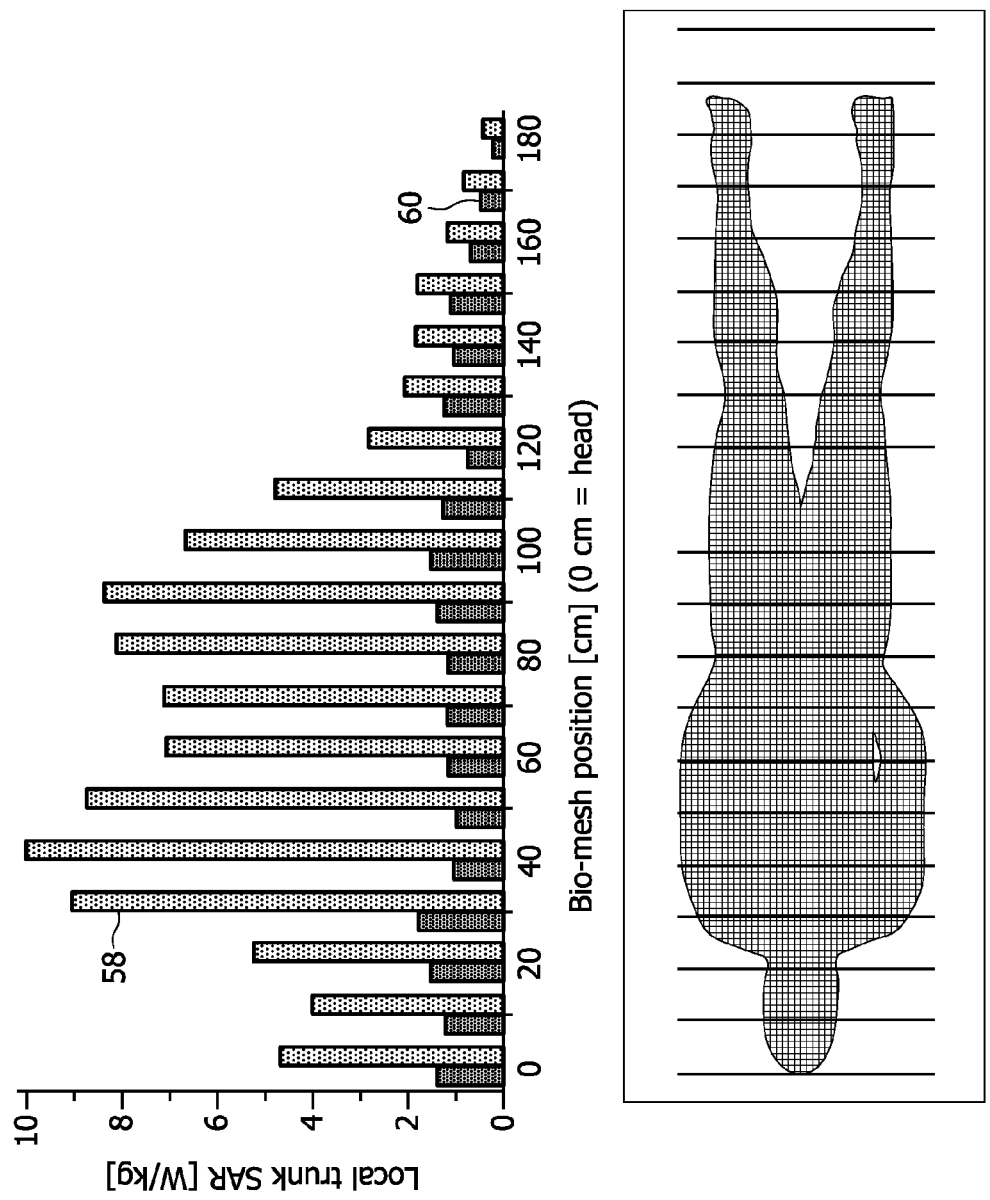
FIG. 5 is a comparison of a worst-case scenario method of calculating SAR to the embodiment that considers all of the information.

In another alternate embodiment, a worst case scenario embodiment, only the maximum amplitude, regardless of the channel is considered. This results in only a coarse estimation of the actual SAR map. FIGS. 4 and 5 illustrate some of the alternate embodiments that consider less than all the information compared to the embodiment that considers all of the available information. In FIG. 4, curve 50 represents the embodiment that considers correct amplitudes, but no phase. Curve 52 represents the embodiment that considers maximum amplitudes in the correct channels. Curve 54 represents the worst case scenario embodiment, where not even channel information is considered. The curves 50, 52, 54 depict the ratio of calculated to actual SAR as a function of the reduction factor. As can be seen, as more information is considered, the closer the estimation of SAR comes to the actual SAR. If these error ratios are acceptable, however, calculation time can be saved by using one of the alternate methods.

FIG. 5 illustrates calculations made using the worst case scenario method 58 compared against the actual calculations 60. FIG. 5 is the position dependence of the local trunk SAR of an 8-channel body coil emulating a standard one-channel body coil, with a phase of 45° and an amplitude of one on all channels. It is evident that the worst case scenario method greatly overestimates SAR, especially in the midsection of the patient, leading to less accurate calculations of SAR. Also evident is the dependence of SAR on position.

In another alternate embodiment, the SAR calculation processor 36, sub-processor 38 or any other components can be located on a remote server. Multiple clients can be served simultaneously by the server. When multiple requests for SAR values appear concurrently, the server can prioritize them based on the order of arrival, or based on other priorities.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A magnetic resonance system comprising:
   a main magnet which generates a substantially uniform main magnetic field in an examination region;
   a multi-channel radio frequency coil assembly including a plurality of coil elements and a transmitter array including a plurality of transmitters which induces magnetic resonance in selected dipoles of a subject located at an initial position in the examination region;
   a receive array which receives magnetic resonance signals;
   a specific energy absorption rate calculation processor that calculates a specific energy absorption rate for the multi-channel radio frequency coil assembly;
   a sequence controller that reconfigures RF excitation pulses that account for the local specific energy absorption rate hotspots; and
   a subject position calculation processor that determines the initial position of the subject within the main magnet and provides the initial position to the specific energy absorption rate calculation processor for calculating the specific energy absorption rate,
   wherein the specific energy absorption rate calculation processor further calculates a globally safe RF pulse waveform that accounts for the calculated specific energy absorption rate, a trajectory of the RF pulse, B1 field maps, a target excitation pattern, and a global Q-matrix; and wherein the global Q-matrix is a Hermitian positive definite matrix corresponding to a specific subject volume of the subject in the examination region.

2. The magnetic resonance system as set forth in claim 1, further including a graphics processing unit that includes a plurality of parallel processing channels that aids in processing the calculation of the specific energy absorption rate and the local specific energy absorption rate hotspots.

3. The magnetic resonance system as set forth in claim 1, further including:

a memory that includes pre-determined values for at least one of electric fields, the global Q-matrix, and model patient data.

4. A method of magnetic resonance comprising the acts of:
generating a substantially uniform main magnetic field in an examination region by a magnet;
inducing magnetic resonance in selected dipoles of a subject located at an initial position in the examination region, and receiving the magnetic resonance;
determining the initial position of the subject within the examination region;
calculating a specific energy absorption rate corresponding to the initial position of the subject;
calculating a globally safe RF pulse waveform that accounts for the calculated specific energy absorption rate;
updating the globally safe RF pulse based on the initial position of the subject;
determining a position of at least one local specific energy absorption rate hotspot in the subject; and
updating a global Q-matrix by adding in a weighted volume-averaged Q-matrix of the at least one hotspot, wherein the global Q-matrix is a Hermitian positive definite matrix corresponding to a specific subject volume of the subject in the examination region.

5. The method as set forth in claim 4, further including the acts of:
applying the globally safe RF pulse; and
calculating a spatial specific energy absorption rate distribution induced by the globally safe RF pulse in the subject.

6. The method as set forth in claim 4, wherein the weighted volume-averaged Q-matrix is calculated by considering a radius of spatial averaging around the at least one hotspot, a position of the at least one hotspot, at least one local Q-matrix, and weighting factors.

7. The method as set forth in claim 4, further including the act of:
calculating an optimized RF pulse waveform from the updated global Q-matrix;
applying the optimized RF pulse waveform.

8. The method as set forth in claim 7, further including the act of:
repeating at least the acts of updating the global Q-matrix and calculating an optimized RF pulse waveform until the specific energy absorption rate converges to a desired value.

9. A method of magnetic resonance comprising the acts of:
generating a substantially uniform main magnetic field in an examination region by a magnet;
inducing magnetic resonance in selected dipoles of a subject located at an initial position in the examination region, and receiving the magnetic resonance;
determining the initial position of the subject within the examination region;
calculating a specific energy absorption rate corresponding to the initial position of the subject;
calculating a globally safe RF pulse waveform that accounts for the calculated specific energy absorption rate; and
updating the globally safe RF pulse based on the initial position of the subject,
wherein the act of calculating the globally safe RF pulse waveform includes accounting for a trajectory of the RF pulse, B1 field maps, a target excitation pattern, and a global Q-matrix, wherein the global Q-matrix is a Hermitian positive definite matrix corresponding to a specific subject volume of the subject in the examination region.

10. A non-transitory computer readable medium comprising computer instructions which, when executed by a processor, configure the processor to perform the acts of:
generating a substantially uniform main magnetic field in an examination region by a magnet;
inducing magnetic resonance in selected dipoles of a subject located at an initial position in the examination region, and receiving the magnetic resonance;
determining the initial position of the subject within the examination region;
calculating a specific energy absorption rate corresponding to the initial position of the subject;
calculating a globally safe RF pulse waveform that accounts for the calculated specific energy absorption rate; and
updating the globally safe RF pulse based on the initial position of the subject,
wherein the act of calculating the globally safe RF pulse waveform includes accounting for a trajectory of the RF pulse, B1 field maps, a target excitation pattern, and a global Q-matrix, wherein the global Q-matrix is a Hermitian positive definite matrix corresponding to a specific subject volume of the subject in the examination region.

11. The method as set forth in claim 4, wherein the act of calculating a specific energy absorption rate includes calculating the specific energy absorption rate based on a single sample obtained with an RF pulse of a plurality of RF pulses having constant amplitudes and phases for at least one of patient safety and hot spot suppression.

12. The magnetic resonance system of claim 1, wherein the specific energy absorption rate calculation processor is configured to calculate the specific energy absorption rate based on a single sample obtained with an RF pulse of a plurality of RF pulses having constant amplitudes and phases for at least one of patient safety and hot spot suppression.

13. The non-transitory computer readable medium of claim 10, wherein the act of calculating the specific energy absorption rate calculates the specific energy absorption rate based on a single sample obtained with an RF pulse of a plurality of RF pulses having constant amplitudes and phases for at least one of patient safety and hot spot suppression.

14. The magnetic resonance system of claim 1, wherein the subject position calculation processor further estimates a volume and a size of the subject, refines a model of the subject for correlation with transverse slices of the subject, and monitors a movement of a table that the subject is on to determine a new position of the subject.

15. The method of claim 4, wherein a new position of the subject is determined based on the acts of:
estimating a volume and a size of the subject;
refining a model of the subject for correlation with transverse slices of the subject; and
monitoring a movement of a table that the subject is on.

16. The non-transitory computer readable medium of claim 10, wherein the computer instructions which, when executed by a processor, further configure the processor to determine a new position of the subject by performing the acts of:
estimating a volume and a size of the subject;
refining a model of the subject for correlation with transverse slices of the subject; and
monitoring a movement of a table that the subject is on.

* * * * *